(12) United States Patent
Wakabayashi et al.

(10) Patent No.: US 8,225,357 B2
(45) Date of Patent: Jul. 17, 2012

(54) WIRELESS COMMUNICATION SYSTEM, BASE STATION APPARATUS, TERMINAL APPARATUS, AND BROADCAST METHOD

(75) Inventors: Yasuhiko Wakabayashi, Tokyo (JP); Satoru Kaneda, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 12/922,328

(22) PCT Filed: Feb. 24, 2009

(86) PCT No.: PCT/JP2009/053282
§ 371 (c)(1),
(2), (4) Date: Sep. 13, 2010

(87) PCT Pub. No.: WO2009/119227
PCT Pub. Date: Oct. 1, 2009

(65) Prior Publication Data
US 2011/0041155 A1    Feb. 17, 2011

(30) Foreign Application Priority Data
Mar. 28, 2008    (JP) .................................. 2008-086204

(51) Int. Cl.
*H04N 7/16*    (2011.01)
(52) U.S. Cl. ........... 725/62; 455/436; 455/438; 455/439
(58) Field of Classification Search .................. 725/62; 455/436, 438–439
See application file for complete search history.

(56) References Cited

U.S. PATENT DOCUMENTS

| | | | |
|---|---|---|---|
| 2004/0121774 A1* | 6/2004 | Rajkotia et al. | 455/441 |
| 2005/0083913 A1* | 4/2005 | Choi et al. | 370/352 |
| 2005/0096051 A1* | 5/2005 | Lee et al. | 455/438 |
| 2005/0118946 A1 | 6/2005 | Colban et al. | |
| 2005/0185630 A1 | 8/2005 | Aoki et al. | |
| 2005/0249142 A1* | 11/2005 | Kim et al. | 370/312 |
| 2006/0003767 A1* | 1/2006 | Kim et al. | 455/436 |
| 2006/0089144 A1* | 4/2006 | Kim et al. | 455/439 |
| 2007/0140173 A1* | 6/2007 | Tomizu | 370/331 |
| 2007/0173246 A1* | 7/2007 | Aoki et al. | 455/422.1 |
| 2007/0298709 A1* | 12/2007 | Sinnarajah et al. | 455/3.05 |
| 2008/0051087 A1* | 2/2008 | Ryu et al. | 455/436 |
| 2008/0242305 A1* | 10/2008 | Kahlert et al. | 455/440 |
| 2008/0248743 A1* | 10/2008 | Krinsky | 455/3.06 |

(Continued)

FOREIGN PATENT DOCUMENTS

EP    1326462 A2    7/2003
(Continued)

OTHER PUBLICATIONS

International Search Report for PCT/JP2009/053282 mailed Apr. 7, 2009.

(Continued)

*Primary Examiner* — Pankaj Kumar
*Assistant Examiner* — Mulugeta Mengesha

(57) ABSTRACT

A terminal apparatus receives data of a program to be viewed selected from among broadcast programs, and notifies viewing information indicating the program to be viewed. A base station apparatus broadcasts the data of the program to a cell, mutually notifies the broadcast program between cells, acquires the viewing information from a terminal apparatus, and starts to broadcast the program in the destination cell when predicting that the terminal apparatus is moving into the cell where the program that is being viewed is not broadcast.

17 Claims, 6 Drawing Sheets

U.S. PATENT DOCUMENTS

2010/0165950 A1* 7/2010 Abeta et al. .................. 370/332

FOREIGN PATENT DOCUMENTS

| EP | 1892978 A1 | 2/2008 |
|---|---|---|
| JP | 2003258897 A | 9/2003 |
| JP | 2004274098 A | 9/2004 |
| JP | 2005057475 A | 3/2005 |
| JP | 2005516474 A | 6/2005 |
| JP | 2007174645 A | 7/2007 |
| JP | 2007215238 A | 8/2007 |
| JP | 2007536790 A | 12/2007 |

OTHER PUBLICATIONS

S. Park et al., "Dynamic multicast and broadcast zone management", IEEE 802.16 Broadband wireless Access Working Group, Nov. 9, 2004, Retrieved from the Internet: <URL:http://www.ieee802.org/16/tge/contrib/C80216e-04_457r1.pdf>.

Supplementary European Search Report for EP 09 72 3767 completed Aug. 29, 2011.

* cited by examiner

WIRELESS COMMUNICATION SYSTEM, BASE STATION APPARATUS, TERMINAL APPARATUS, AND BROADCAST METHOD

The present application is the National Phase of PCT/JP2009/053282, filed Feb. 24, 2009, which claims the benefit of priority to Japanese Patent Application No. 2008-086204 filed on Mar. 28, 2008, the disclosure of which is hereby incorporated by reference in its entirety.

TECHNICAL FIELD

The present invention relates to a communication technique that broadcasts data to each cell in a wireless communication system covering communication areas with cells.

BACKGROUND ART

In a wireless communication system covering communication areas with cells including wireless base stations, provision of the cells enables a wireless terminal to communicate in a wide range. For example, in the WiMAX (Worldwide Interoperability for Microwave Access), small-scale cells referred to as femtocells cover communication areas, thereby allowing communication in various locations. This type of wireless communication systems includes a communication configuration that broadcasts data of a program to wireless terminals (see JP2005-516474A and JP 2007-174645A).

Wireless channels are defined in bands that the wireless communication system can use; a wireless channel for broadcasting a program is selected from thereamong. In the selected wireless channel, program data is broadcast from a wireless base station. A user receives the data on the wireless channel where the program is broadcast with a wireless terminal and is thereby able to view the program.

Typical wireless terminals for viewing this type of broadcasts are stationary terminals, which are represented by a home radio or a television, and portable mobile terminals. Modes of broadcasting programs include a mode of preliminarily opening a broadcast program to the public and then broadcasting at times according to the program, and further include a mode of temporarily modifying the program owing to notification of emergency situations or extension of a currently broadcast program.

In wireless communication systems, wireless resources are limited. Since wireless channels are used for point-to-point communications, the number of wireless channels capable of being used for broadcasting a program is further limited. On the other hand, it is not necessary that all programs be viewed in all cells.

Broadcast of a program to a cell where no user views the program causes waste of a wireless channel. Accordingly, a consideration is given to selecting programs for each cell such that programs that users do not view will not be broadcast. In this case, it is necessary to consider allowing a user, who moves between cells while viewing the program with a mobile terminal, to continue viewing the program.

On the other hand, JP2003-258897A discloses a technique that transmits a multicast packet to a predicted destination of a mobile terminal. JP 2007-215238A discloses a technique that predicts movement of a mobile terminal.

DISCLOSURE OF THE INVENTION

The above-described technique that preliminarily starts to transmit a packet to a predicted destination of a mobile terminal is based on a premise of one-to-n multicast communication where viewers are specified. However, in a broadcast communication assuming that unspecified users view the program, it is basically impossible to recognize which program the mobile terminal views. Accordingly, it is difficult to preliminarily start to broadcast the program in the predicted destination of the mobile terminal.

It is an object of the present invention to provide a technique that allows a user who moves between cells while viewing a program to continue viewing with respect to a broadcast by a wireless communication system covering communication areas with cells.

In order to achieve the above object, a wireless communication system according to an aspect of the present invention includes:

a terminal apparatus that receives data of a program to be viewed selected from among broadcast programs and notifies viewing information indicating the program to be viewed; and a base station apparatus that acquires the viewing information from the terminal apparatus and, when it is predicted that the terminal apparatus is moving into a cell where a program that is being viewed is not broadcast, starts to broadcast the program in the destination cell.

A broadcast method according to an aspect of the present invention includes:

acquiring viewing information indicating a program to be viewed from a terminal apparatus receiving data of the program to be viewed selected from among programs broadcast from a base station apparatus; and starting to broadcast the program in a destination cell when it is predicted that the terminal apparatus is moving into the cell where the program on view is not broadcast on the basis of the viewing information.

BEST MODE FOR CARRYING OUT THE INVENTION

The present invention will be described in detail with reference to the drawings with respect to an exemplary embodiment.

Figure 1:
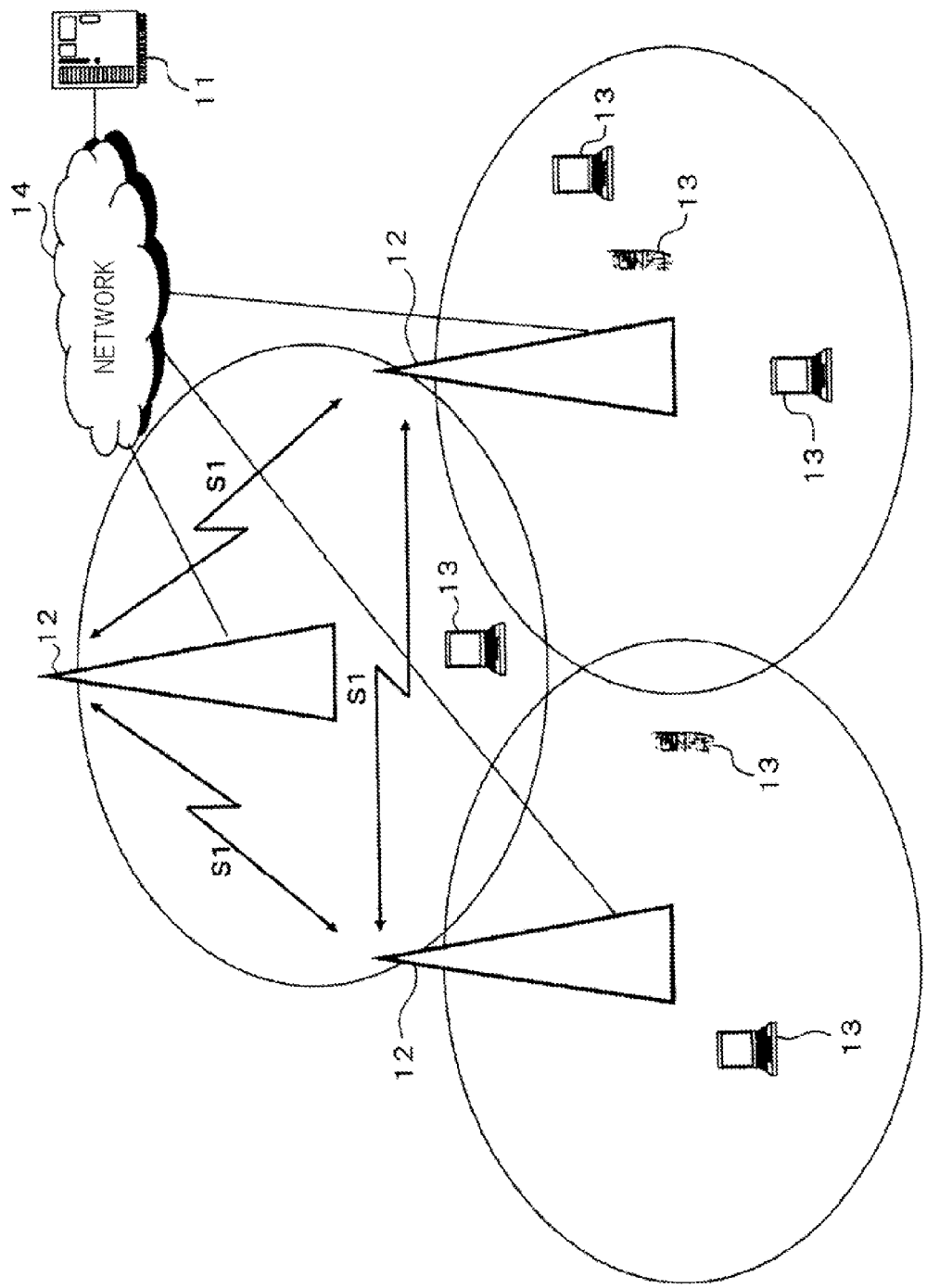
FIG. 1 is a block diagram showing a configuration of a wireless communication system according to an exemplary embodiment.

FIG. 1 is a block diagram showing a configuration of a wireless communication system according to an exemplary embodiment. Referring to FIG. 1, the wireless communication system includes broadcast server 11, base station apparatus 12 and terminal apparatus 13.

Broadcast server 11 transmits data of a program for broadcast to base station apparatus 12 via network 14. One broadcast server 11 may transmit pieces of data of programs. Broadcast servers 11 broadcast programs different from each other. As a result, pieces of data of programs are transmitted to base station apparatus 12.

Each base station apparatus 12 includes a cell, and broadcasts the data of the program received from broadcast server 11 on a wireless channel. However, not all programs are viewed in all cells. Base station apparatus 12 selects the program to be broadcast according to situations of viewing of the program on terminal apparatus 13. Thus, a viewing notification including information of the program that is being viewed is transmitted from terminal apparatus 13 to base station apparatus 12. This allows base station apparatus 12 to recognize the program viewed at terminal apparatus 13. However, it is not necessary that all terminal apparatuses 13 transmit the viewing notification. Terminal apparatuses 13 transmitting the viewing notification and terminal notification 13 not transmitting the viewing notification may be defined, thereby differentiating users.

Base station apparatuses 12 are capable of communicating with each other (S1), in addition to communication with terminal apparatus 13. Base station apparatuses 12 mutually transmit an inter-base station notification including information of a broadcasting program, between neighboring base station apparatuses 12.

Figure 7:
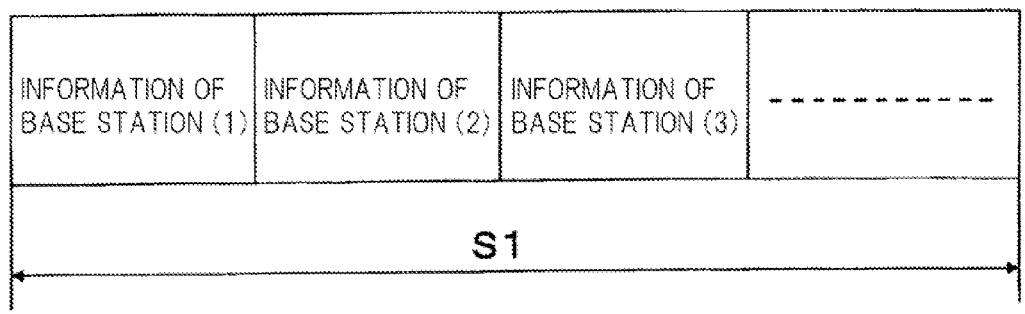
FIG. 7 is a diagram showing an example of information transmitted and received between base station apparatuses 12.

FIG. 7 is a diagram showing an example of information transmitted and received between base station apparatuses 12. Referring to FIG. 7, information S1 includes pieces of information of base station apparatuses 12(1), 12(2), 12(3) . . . neighboring each other. For example, base station apparatus 12(1) transmits a piece of information of base station apparatus 12(1), and receives pieces of information of base station apparatuses 12(2), 12(3) . . . . Accordingly, each base station apparatus 12 recognizes programs broadcast at neighboring base station apparatuses 12.

Base station apparatus 12 monitors the location of terminal apparatus 13 and thereby predicts the movement of terminal apparatus 13 viewing the program broadcast by base station apparatus 12 itself into the neighboring cell where the program is not broadcast. When it is predicted that mobile terminal 13 will move into the neighboring cell where the program that is being viewed is not broadcast, base station apparatus 12 transmits a broadcast instruction for instructing the start of broadcasting the program to base station apparatus 12 as the destination.

On reception of the broadcast instruction from neighboring base station apparatuses 12, if a wireless channel capable of being assigned to the program is available, base station apparatus 12 assigns the wireless channel to the program instructed by the broadcast instruction and starts broadcasting. When the wireless channel identical to that used by base station apparatus 12 having transmitted the broadcast instruction is available in base station apparatus 12 having received the broadcast instruction, the same wireless channel may be assigned. This allows terminal apparatus 13 to continue viewing the same program without switching the wireless channel when moving between the cells.

Figure 8:
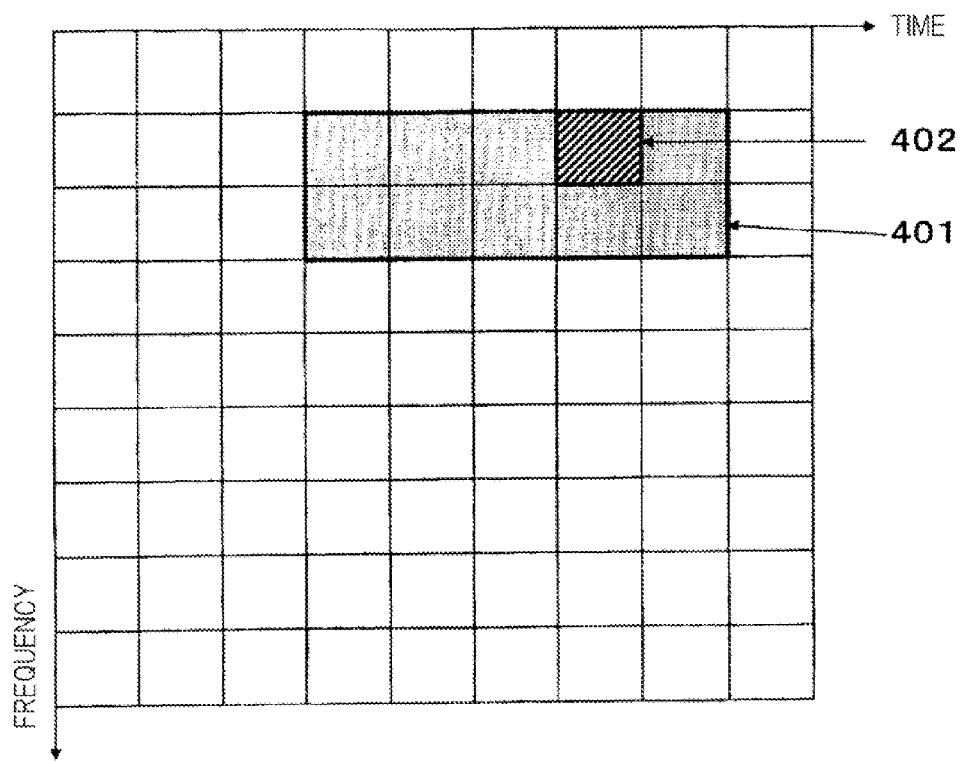
FIG. 8 is a diagram showing an example of a configuration of a wireless channel of base station apparatus 12.

FIG. 8 is a diagram showing an example of a configuration of a wireless channel of base station apparatus 12. Referring to FIG. 8, there are wireless channels divided according to a time axis and a frequency axis and arranged in a matrix manner. Here, as an example, only specific wireless channels 401 are assignable for broadcasting the program. When starting broadcast of the program, base station apparatus 12 assigns wireless channel 402 selected from wireless channels 401 to the program. In a case where the program data requires high throughput, the wireless channels may be assigned.

Terminal apparatus 13 selects any one of programs broadcast from base station apparatus 12 according to an operation by the user, and receives (views) the data of the program. Terminal apparatus 13 then transmits the viewing notification including information of the program that is being viewed to base station apparatus 12.

When terminal apparatus 13 moves between the cells in a situation of viewing the program, the state of receiving the data of the program broadcast from original base station apparatus 12 is changed into a state of receiving the data of the program broadcast from base station apparatus 12 as the destination. Here, if the wireless channels where original and destination base station apparatuses 12 broadcast the same program are different from each other, terminal apparatus 13 will perform a process of switching the wireless channel for reception.

Figure 2:
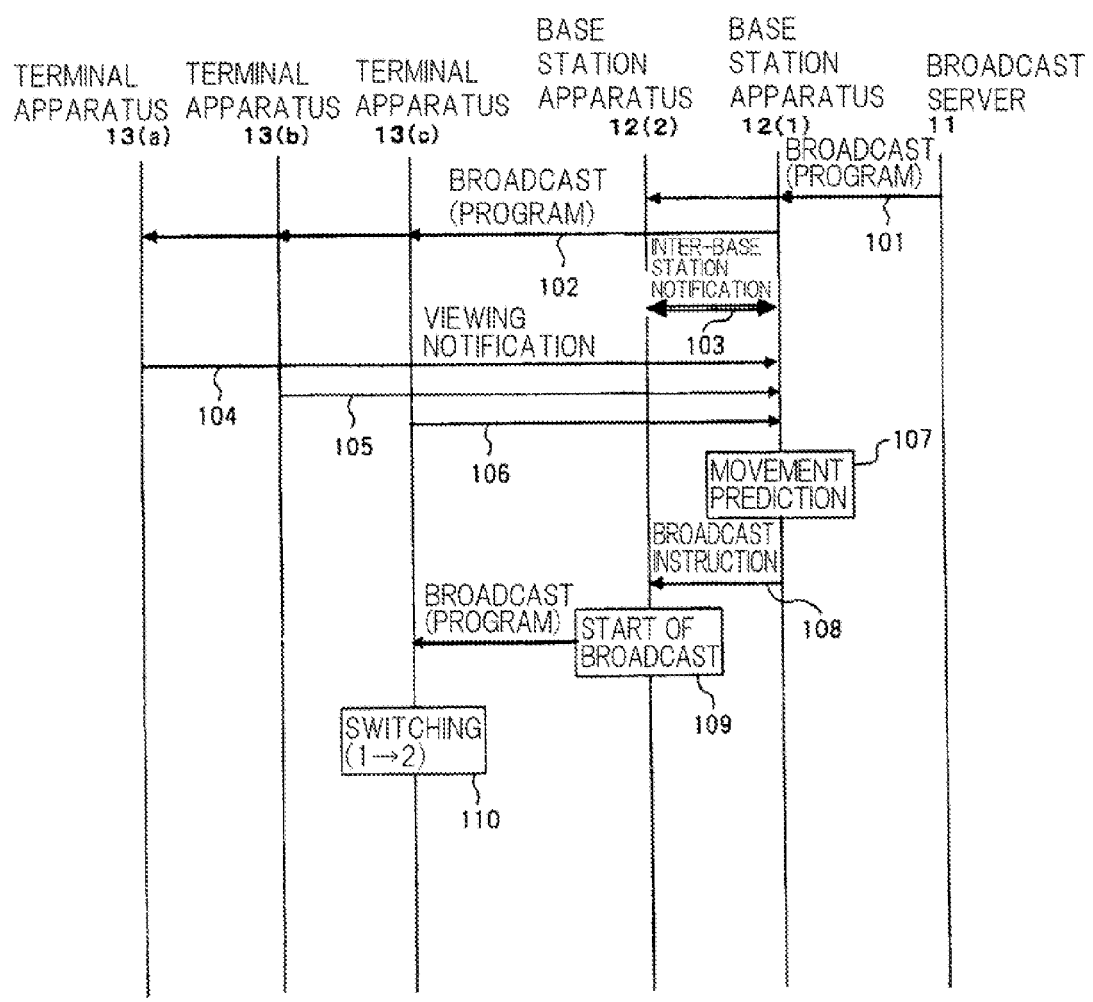
FIG. 2 is a sequence diagram showing an operation of the wireless communication system according to this exemplary embodiment.

FIG. 2 is a sequence diagram showing an operation of the wireless communication system according to this exemplary embodiment. Here, description will be made using a configuration including two base station apparatuses 12(1) and (2) and three terminal apparatuses 13(a) to (c). Referring to FIG. 2, data of a certain program is transmitted from broadcast server 11 to base station apparatuses 12(1) and (2) (step 101). Although the program transmitted from broadcast server 11 is broadcast by base station apparatus 12(1), the program is not broadcast by base station apparatus 12(2) (step 102). It is provided that terminal apparatuses 13(a) to (c) receive the data of the program broadcast from base station apparatus 12(1).

Base station apparatus 12(1) and base station apparatus 12(2) transmit and receive inter-base station notifications to and from each other, and recognize the programs broadcast by the opposite parties with respect to each other (step 103).

Each of terminal apparatuses 13(a) to (c) transmits a viewing notification to base station apparatus 12(1), thereby notifying base station apparatus 12(1) that the terminal apparatus is viewing the program (step 104 to 106).

Base station apparatus 12 predicts the movement of terminal apparatus 13(a) to (c), which is viewing the program broadcast by base station apparatus 12 itself, into the neighboring cell where the program is not broadcast, on the basis of the viewing notification received from each of terminal apparatuses 13(a) to (c) (step 107). Here, it is provided that the movement of terminal apparatus 13(a) viewing the program into the cell of base station apparatus 12(2) not broadcasting the program is predicted.

When base station apparatus 12(1) predicts the movement of terminal apparatus 13(a) into the cell of base station apparatus 12(2), base station apparatus 12(1) transmits a broadcast instruction to base station apparatus 12(2), thereby urging base station apparatus 12(2) to start to broadcast the program (step 108).

If an assignable wireless channel is available, base station apparatus 12(2) having received the broadcast instruction assigns the wireless channel to the instructed program and starts broadcasting (step 109).

Here, it is provided that terminal apparatus 13(a) moves into the cell of base station apparatus 12(2) as predicted by base station apparatus 12(1). When terminal apparatus 13(a) moves to the cell of base station apparatus 12(2), a state of terminal apparatus 13(a) receiving the data of the program from base station apparatus 12(1) changes into a state of receiving the data of the program from base station apparatus 12(2) (step 110).

Figure 3:
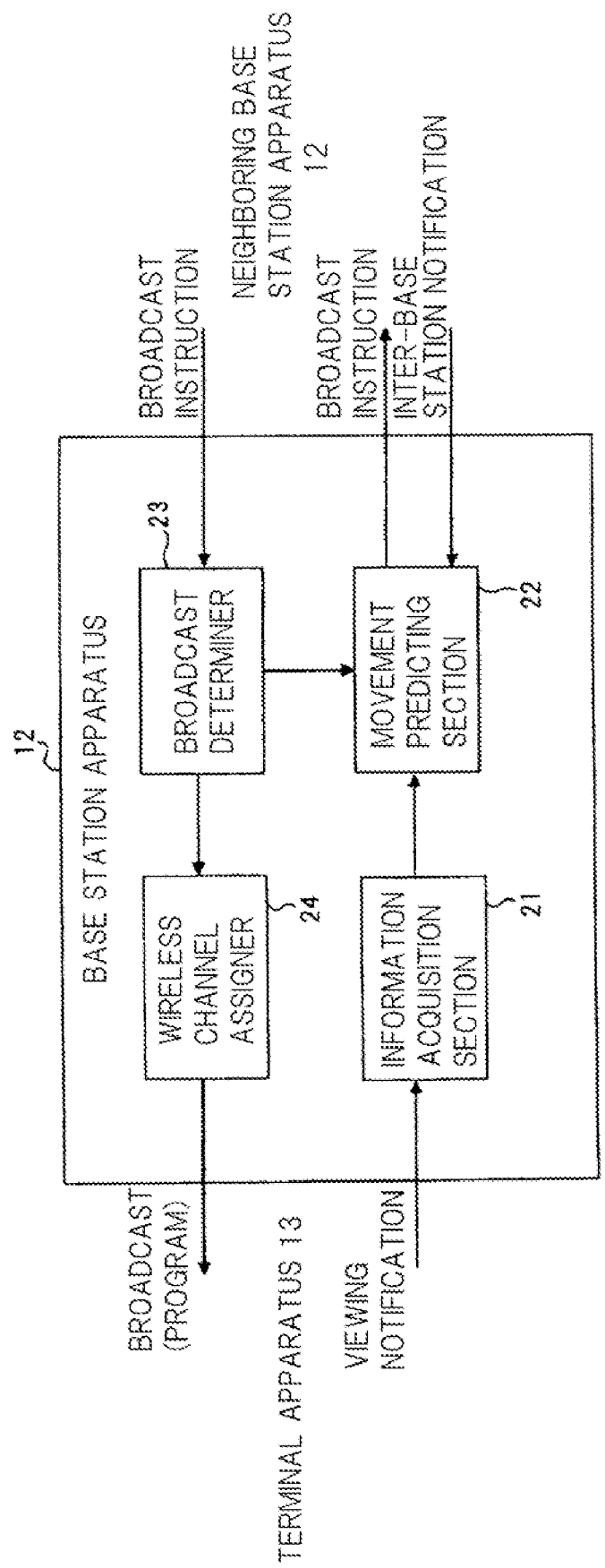
FIG. 3 is a block diagram showing a configuration of base station apparatus 12 of this exemplary embodiment.

FIG. 3 is a block diagram showing a configuration of base station apparatus 12 of this exemplary embodiment. Referring to FIG. 3, base station apparatus 12 includes information acquisition section 21, movement predicting section 22, broadcast determiner 23 and wireless channel assigner 24.

Information acquisition section 21 receives the viewing notification from terminal apparatus 13, and acquires the viewing information representing which program is viewed at each terminal apparatus 13. Information acquisition section 21 acquires location information of terminal apparatus 13. For example, terminal apparatus 13 may acquire its own location information by means of a GPS (Global Positioning System) and notify base station apparatus 12 of the information.

Movement predicting section 22 receives the inter-base station notification from another neighboring base station apparatus 12, and acquires broadcast information representing which program is broadcast at neighboring base station apparatus 12. Movement predicting section 22 then predicts the movement of terminal apparatus 13, which is viewing the program broadcast by the apparatus itself, into the neighboring cell where the program is not broadcast, on the basis of the broadcast information, and the viewing information and the location information acquired by information acquisition section 21. When it is predicted that terminal apparatus 13 viewing the program broadcast by the apparatus itself is moving into the neighboring cell where the program is not broadcast, base station apparatus 12 transmits the broadcast instruction for instructing broadcast of the program to base station apparatus 12 as the destination.

Broadcast determiner 23 receives the broadcast instruction from neighboring base station apparatus 12, and determines whether the program that the broadcast instruction instructs to broadcast has been started or not. For example, if a wireless channel assignable to the program is available, broadcast determiner 23 determines to start broadcasting the program. The program that broadcast determiner 23 has determined to start broadcasting is notified to movement predicting section 22 and added to programs broadcast from the apparatus itself.

Wireless channel assigner 24 assigns a wireless channel to the program that broadcast determiner 23 has determined to broadcast, and broadcasts the data.

Information acquisition section 21 may further acquire reception level information that represents a reception level at each terminal apparatus 13. Movement predicting section 22 may use the reception level information for a process for predicting the movement of terminal apparatus 13. For example, there is a high possibility that terminal apparatus 13 having a tendency that the reception level is decreasing is moving in a direction away from base station apparatus 12. This information can be used for movement prediction.

Because the reception level of terminal apparatus 13 moving into a neighboring cell becomes a prescribed threshold or less around the boundary with the neighboring cell according to the movement, only terminal apparatus 13 whose reception level is equal to or less than the threshold may be determined as a target for movement prediction. As a result, the number of terminal apparatuses 13 as targets of the movement prediction is restricted. Accordingly, this allows the processing load of base station apparatus 12 to be decreased.

Movement predicting section 22 may determine only terminal apparatus 13 viewing the program broadcast by the apparatus itself as the target of the movement prediction. Further, movement predicting section 22 may determine only terminal apparatus 13 viewing the program broadcast by the apparatus itself but not by the neighboring cells as the target of the movement prediction. These allow the processing load of base station apparatus 12 to be decreased.

Figure 4:
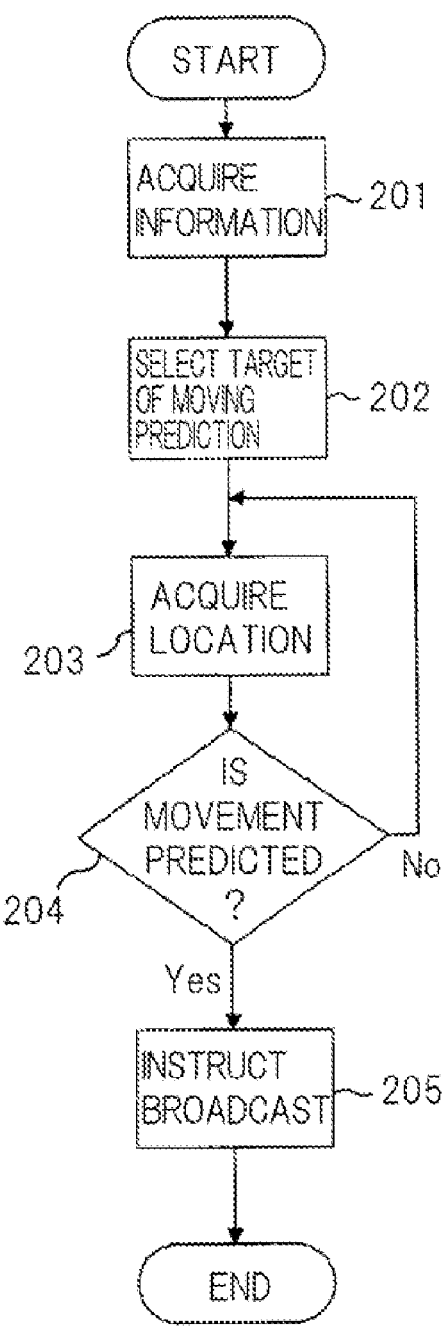
FIG. 4 is a flowchart showing an example of an operation of base station apparatus 12.

FIG. 4 is a flowchart showing an example of an operation of base station apparatus 12. Referring to FIG. 4, first, base station apparatus 12 receives the viewing notification from terminal apparatus 13 and thereby acquires the viewing information about which program is viewed at each terminal apparatus 13 (step 201).

Next, base station apparatus 12 selects terminal apparatus 13 as the target of the movement prediction (step 202). Subsequently, base station apparatus 12 acquires the location information of terminal apparatus 13 (step 203), and then determines whether the movement of terminal apparatus 13, which is viewing the program broadcast by base station apparatus 12 itself, into the neighboring cell where the program is not broadcast is predicted or not (step 204).

If there is no terminal apparatus 13 whose movement into the neighboring cell where the program on view is not broadcast is predicted, base station apparatus 12 returns to step 203 and continues the movement prediction. If there is terminal apparatus 13 whose movement into the neighboring cell where the program on view is not broadcast is predicted, base station apparatus 12 transmits the broadcast instruction to base station apparatus 12 at the neighboring cell, thereby instructing the start of broadcasting (step 205).

Figure 5:
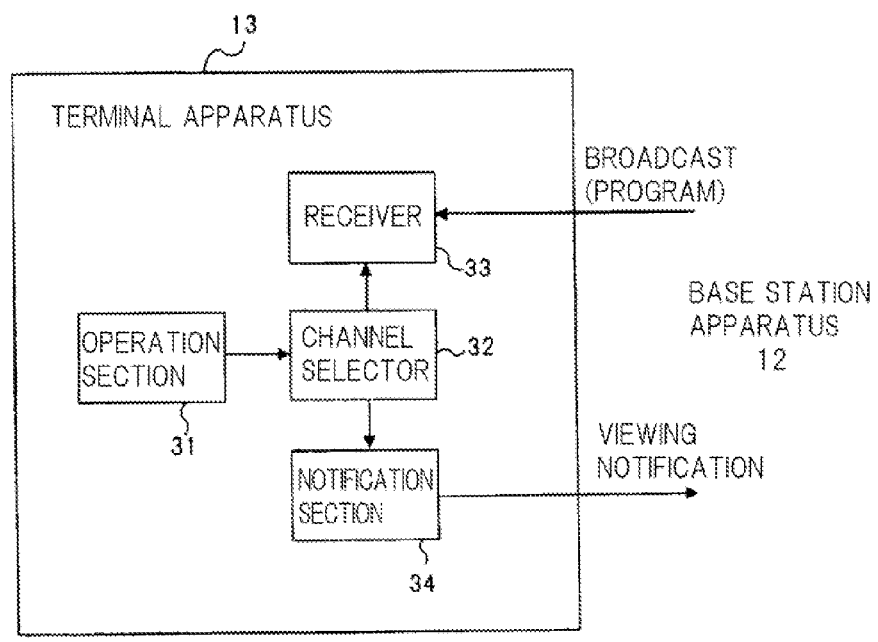
FIG. 5 is a block diagram showing a configuration of terminal apparatus 13.

FIG. 5 is a block diagram showing a configuration of terminal apparatus 13. Referring to FIG. 5, terminal apparatus 13 includes operation section 31, channel selector 32, receiver 33, and notification section 34.

Operation section 31 accepts operations by a user. For example, the operations include operations for starting and terminating viewing of broadcast and an operation for selecting a program to be viewed.

Channel selector 32 selects the program to be viewed and a wireless channel where the program is broadcast, according to the contents of the operation accepted at operation section 31. For example, the correspondence between the program and the wireless channel may preliminarily be notified by base station apparatus 12.

Receiver 33 receives radio waves on the wireless channel selected by channel selector 32 and acquires the program data.

Notification section 34 transmits the viewing notification including the information of the program selected by channel selector 32 and thereby notifies base station apparatus 12 of the program that is being viewed.

As described above, in this exemplary embodiment, terminal apparatus 13 notifies base station apparatus 12 of the program that is being viewed; base station apparatus 12 having received the notification predicts the movement of terminal apparatus 13 viewing the program; if the movement into the cell where the program that is being viewed is not broadcast, base station apparatus 12 as the destination starts broadcast. More specifically, if the movement of terminal apparatus 13 into the cell where the program that is being viewed is not broadcast is predicted according to the movement prediction based on the information of the program viewed at terminal apparatus 13, the destination cell starts the broadcast. Accordingly, this allows the terminal apparatus moving between the cells while viewing the program to continue viewing.

Further, according to this exemplary embodiment, base station apparatus 12 predicts the movement only on terminal apparatus 13 viewing the program broadcast by base station apparatus 12 itself, thereby decreasing the processing load.

Moreover, according to this exemplary embodiment, base station apparatus 12 predicts the movement only on terminal apparatus 12 viewing the program broadcast by base station apparatus 12 itself but not by neighboring base station apparatus 12, thereby further decreasing the processing load.

Note that, in this exemplary embodiment, the wireless channel used by base station apparatus 12 having newly mediated the broadcast of the program may be notified to terminal apparatus 13 viewing the program. With prediction of movement into the cell where the program that is being viewed is not broadcast, the wireless channel used by the destination base station apparatus 12 may be notified from predicted destination base station apparatus 12 to terminal apparatus 13 where the broadcast of the program has been started. Terminal apparatus 13 may switch the wireless channel for reception when moving between the cells with different wireless channels assigned to the program that is being viewed.

Figure 6:
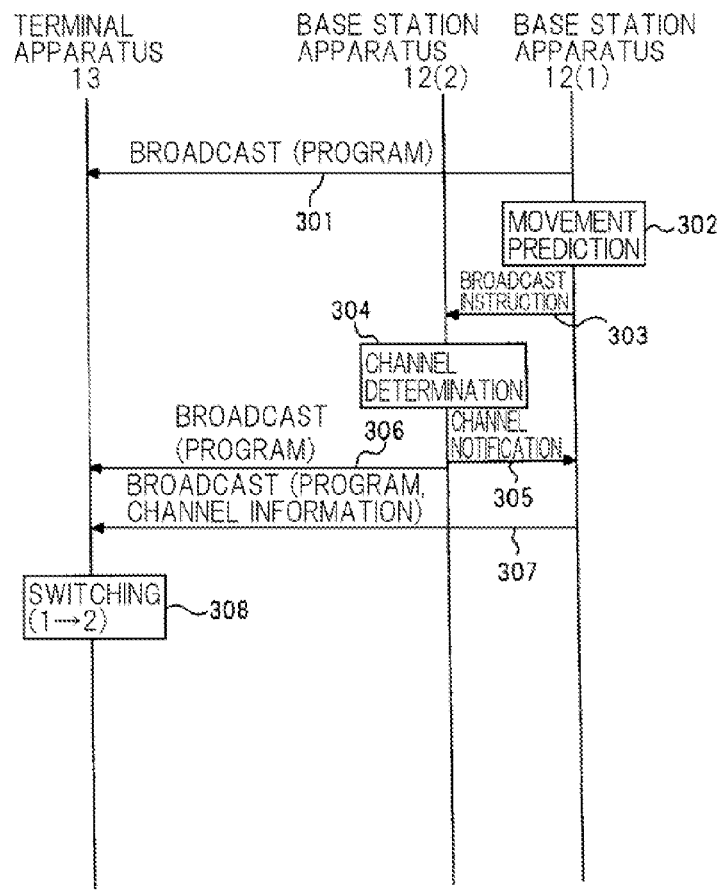
FIG. 6 is a sequence diagram showing an operation of the wireless communication system when terminal apparatus 13 moves between cells to which different wireless channels are assigned for a program on view.

FIG. 6 is a sequence diagram showing an operation of the wireless communication system when the wireless channels assigned to the program that is being viewed between the cells where terminal apparatus 13 moves are different from each other. It is provided that the program broadcast by base station apparatus 12(1) is viewed at terminal apparatus 13 (step 301). It is provided that the program is not broadcast by base station apparatus 12(2).

Base station apparatus 12(1) performs the movement prediction on terminal apparatus 13 as the target (step 302). If it is predicted that terminal apparatus 13 will move into the cell of base station apparatus 12(2), base station apparatus 12(1) will transmit the broadcast instruction to base station apparatus 12(2) (step 303).

Base station apparatus 12(2) having received the broadcast instruction determines the wireless channel to be assigned to the instructed program (step 304). Here, it is provided that the determined wireless channel is different from the wireless channel used by base station apparatus 12(1).

Base station apparatus 12(2) notifies base station apparatus 12(1) of the determined wireless channel (step 305), and starts the broadcast using the wireless channel (step 306).

Base station apparatus 12(1) having received the notification of the wireless channel from base station apparatus 12(2) notifies terminal apparatus 13 of the wireless channel, where the broadcast from base station apparatus 12(2) is to be started, as channel information (step 307). Here, in this example, base station apparatus 12(1) multiplexes the channel information and the data of the program into the wireless channel for transmission where the program is broadcast. This allows the wireless channel to be efficiently used, and allows terminal apparatus 13 receiving (viewing) the data of the program as the target to be reliably notified of the channel information. Here, base station apparatus 12(1) may transmit the channel information to terminal apparatus 13 that is viewing the program broadcast by base station apparatus 12(1) and that is predicted to move to base station apparatus 12(2). In this case, the channel information may include destination information identifying terminal apparatus 13.

Terminal apparatus 13 transitions from a state of receiving the data of the program from base station apparatus 12(1) into a state of receiving the data of the program from base station apparatus 12(2) when moving between the cells (step 308).

In this exemplary embodiment, the example where the entire data of the programs is multicast from broadcast server 11 to every base station apparatus 12 and then each base station apparatus 12 controls which program is broadcast on the wireless channel is described. According to this configuration, when broadcasting of the new program is started, the process of establishing a new session between broadcast server 11 and base station apparatus 12 or the process of adding new base station apparatus 12 to the multicast session is not required. This allows the broadcast to be swiftly started.

However, the present invention is not limited to this example. As another example, from broadcast server 11 to each base station apparatus 12, only the program data broadcast on the wireless channel at base station apparatus 12 may be transmitted. In this case, when broadcasting of the new program is started, the process of establishing a new session between broadcast server 11 and base station apparatus 12 or the process of adding new base station apparatus 12 to the multicast session is performed. This allows the traffic on network 14 to be reduced.

Although the description above has been made on the exemplary embodiments, the present invention is not limited to the above-described exemplary embodiments. The exemplary embodiments may be combined or a part of the configuration may be modified, within the scope of the technical thought of the present invention.

The invention claimed is:

1. A wireless communication system, comprising:
a terminal apparatus that receives data of a program to be viewed selected from among broadcast programs and notifies viewing information indicating the program to be viewed; and
a base station apparatus that acquires the viewing information from the terminal apparatus and, when it is predicted that the terminal apparatus is moving into a cell where a program that is being viewed is not broadcast, starts broadcasting the program in the destination cell, wherein
the base station apparatus, while broadcasting data of the program to its own cell, mutually notifies the program being broadcast as inter-base station notification between cells, and uses the viewing information and the inter-base station notification to predict movement of the terminal apparatus into the cell where the program on view is not being broadcast.

2. The wireless communication system according to claim 1, wherein the base station apparatus, when predicting that the terminal apparatus viewing the program being broadcast by the base station apparatus itself is moving into the cell where the program is not being broadcast, transmits, to the base station apparatus including the destination cell, a broadcast instruction for urging the base station apparatus to start to broadcast the program, and, upon receiving the broadcast instruction from another base station apparatus, starts to broadcast the program instructed by the broadcast instruction.

3. The wireless communication system according to claim 2, wherein the base station apparatus as the destination having received the broadcast instruction, when starting to broadcast the program instructed by the broadcast instruction, notifies the original base station apparatus having transmitted the broadcast instruction of a wireless channel assigned to the program, and the original base station apparatus transmits channel information indicating the wireless channel to the terminal apparatus.

4. The wireless communication system according to claim 3, wherein the original base station apparatus transmits the channel information on the wireless channel where the original base station apparatus itself is broadcasting the program in a multiplexed manner.

5. The wireless communication system according to claim 2, wherein the original base station apparatus transmitting the broadcast instruction notifies the base station as the destination of a wireless channel in the cell of the original base station apparatus for the program that the broadcast instruction urges that broadcasting be started, and the base station apparatus as the destination assigns a wireless channel identical to the notified wireless channel to the program instructed by the received broadcast instruction.

6. The wireless communication system according to claim 1, wherein the base station apparatus performs movement prediction on the terminal apparatus viewing the program broadcast by the base station apparatus itself but not in the neighboring cell.

7. The wireless communication system according to claim 1, further comprising a broadcast server transmitting the data of the program to the base station apparatus.

8. A base station apparatus, comprising:
an information acquisition section that acquires viewing information indicating a program to be viewed selected by a terminal apparatus from among broadcast programs; and
a movement prediction section that transmits a broadcast instruction for urging a base station apparatus including a cell of a destination to start broadcasting the program, when it is predicted that the terminal apparatus is moving into the cell where the program to be viewed indicated by the viewing information is not being broadcast, wherein the movement prediction section predicts the movement of the terminal apparatus into the cell where the program to be viewed is not being broadcast according to the viewing information and an inter-base station notification for mutually notifying the broadcast program between the cells.

9. The base station apparatus according to claim 8, further comprising a broadcast determination section that receives the broadcast instruction from another base station apparatus and determines a start of broadcasting the program instructed by the broadcast instruction.

10. The base station apparatus according to claim 9, wherein the wireless channel assigned to the program is notified to an original base station apparatus having transmitted the broadcast instruction when the broadcast of the program instructed by the broadcast instruction is started.

11. The base station apparatus according to claim 8, wherein channel information indicating a wireless channel is transmitted to the terminal apparatus when the wireless channel assigned to the program is notified by a base station apparatus as the destination to which the own base station apparatus has transmitted the broadcast instruction.

12. The base station apparatus according to claim 11, wherein the channel information is transmitted on the wireless channel, where the program is being broadcast, in a multiplexed manner.

13. The base station apparatus according to claim 8, wherein the wireless channel in the cell of the base station apparatus itself for the program that the broadcast instruction urges a base station apparatus as a destination to start to broadcast is also notified to the base station apparatus as the destination.

14. The base station apparatus according to claim 9, wherein the program instructed by the broadcast instruction received is assigned with a wireless channel identical to the wireless channel used for broadcasting the program by the original base station apparatus having transmitted the broadcast instruction.

15. The base station apparatus according to claim 8, wherein the movement prediction is performed on the terminal apparatus viewing the program broadcast by the base station apparatus itself but not by a neighboring cell.

16. The base station apparatus according to claim 8, wherein the movement prediction is performed on the terminal apparatus whose reception level of a radio wave at the terminal apparatus is less than a prescribed threshold.

17. A broadcast method, comprising:
acquiring viewing information indicating a program to be viewed from a terminal apparatus receiving data of the program to be viewed selected from among programs being broadcast from a base station apparatus; and
starting to broadcast the program in a destination cell when it is predicted that the terminal apparatus is moving into a cell where the program on view is not being broadcast on the basis of the viewing information, wherein
the base station apparatus, while broadcasting data of the program to its own cell, mutually notifies the program being broadcast as inter-base station notification between cells, and uses the viewing information and the inter-base station notification to predict movement of the terminal apparatus into the cell where the program on view is not being broadcast.

* * * * *